(12) United States Patent
Itoh et al.

(10) Patent No.: US 7,932,183 B2
(45) Date of Patent: Apr. 26, 2011

(54) METHOD OF MANUFACTURING MULTILAYER THIN FILM PATTERN AND DISPLAY DEVICE

(75) Inventors: Yasuyoshi Itoh, Tokyo (JP); Masami Hayashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 733 days.

(21) Appl. No.: 11/934,301

(22) Filed: Nov. 2, 2007

(65) Prior Publication Data
US 2008/0110858 A1 May 15, 2008

(30) Foreign Application Priority Data

Nov. 14, 2006 (JP) .................... 2006-307856
May 23, 2007 (JP) .................... 2007-136972

(51) Int. Cl.
*H01L 21/302* (2006.01)
(52) U.S. Cl. .......... 438/717; 438/706; 438/725; 216/41; 430/310
(58) Field of Classification Search .................. 438/706, 438/717, 725, 745, 742; 430/311, 312, 310; 216/41, 49
See application file for complete search history.

(56) References Cited

U.S. PATENT DOCUMENTS

| | | | |
|---|---|---|---|
| 6,008,065 A | 12/1999 | Lee et al. | |
| 6,195,140 B1 | 2/2001 | Kubo et al. | |
| 6,933,989 B2 * | 8/2005 | Oke et al. | 349/43 |
| 6,977,219 B2 * | 12/2005 | Frost et al. | 438/637 |
| 7,338,911 B2 * | 3/2008 | Kido | 438/745 |
| 2004/0004686 A1 | 1/2004 | Ogawa et al. | |
| 2005/0164459 A1 * | 7/2005 | Young | 438/303 |

FOREIGN PATENT DOCUMENTS

| | | |
|---|---|---|
| JP | 11-101992 | 4/1999 |
| JP | 11-345974 | 12/1999 |
| JP | 2002-110631 | 4/2002 |
| JP | 2003-255378 | 9/2003 |
| JP | 2004-294804 | 10/2004 |
| JP | 2005-215277 | 8/2005 |
| JP | 2005-275323 | 10/2005 |
| JP | 2006-41265 | 2/2006 |

OTHER PUBLICATIONS

U.S. Appl. No. 12/432,320, filed Apr. 29, 2009, Miyamoto, et al.

* cited by examiner

*Primary Examiner* — Lan Vinh
(74) *Attorney, Agent, or Firm* — Oblon, Spivak, McClelland, Maier & Neustadt, L.L.P.

(57) ABSTRACT

A method of manufacturing a multilayer thin film pattern includes forming a metal film over a substrate, forming a second thin film over the metal film, forming a resist pattern over the second thin film, etching the second thin film using the resist pattern as a mask, transforming the resist pattern using an organic solvent or a RELACS agent to cover an edge face of the etched second thin film and etching the metal film while the edge face of the second thin film is covered with the resist pattern.

15 Claims, 9 Drawing Sheets

RELATED ART

METHOD OF MANUFACTURING MULTILAYER THIN FILM PATTERN AND DISPLAY DEVICE

BACKGROUND OF THE INVENTION

1. Field of the Invention

The present invention relates to a multilayer thin film pattern and a method of manufacturing a display device.

2. Description of Related Art

For liquid crystal displays, there are for example a transmissive type, a reflective type and a transflective type liquid crystal display (for example see Japanese Unexamined Patent Application Publication No. 11-101992). A transmissive liquid crystal display shows an image by a backlight disposed at its back. A reflective liquid crystal display shows an image by its surrounding light reflected on a reflector surface which is disposed to a substrate. Therefore, the reflective liquid crystal display includes a pixel electrode for reflecting light, that is, a reflective pixel electrode. A transflective liquid crystal display transmits a part of light and reflects a part of light. In the transflective liquid crystal display, a TFT array substrate has both a transmissive pixel electrode (transmissive electrode) and a reflective pixel electrode.

In the transmissive liquid crystal display, it is usually required that both a pixel electrode over a TFT array substrate and an opposing electrode over a color filter substrate are transparent, and a transparent conductive film, such as ITO, is used for both of them as an electrode material. Accordingly, at the time of the alternating current drive of a liquid crystal, the abovementioned pixel electrode and the opposing electrode can apply positive and negative voltages to the liquid crystal under almost the same conditions. On the other hand, in the transflective liquid crystal display, a metal film such as Al is used as a reflective pixel electrode (reflective electrode). Therefore, display flicker and liquid crystal image sticking are generated according to the driving condition due to a work function difference with the transparent conductive film which is the opposing electrode.

As a countermeasure for such flicker and image sticking, a technique for forming a transparent conductive film made of the same material as an opposing electrode over a metal of a reflective electrode is disclosed in Japanese Unexamined Patent Application Publication Nos. 2003-255378 and 2005-275323. In Japanese Unexamined Patent Application Publication No. 2005-275323, the metal film of the reflective electrode and the transparent conductive film over the reflective electrode are collectively wet etched using the same etchant and the same mask pattern. This enables to form the reflective electrode and the transparent conductive film which has the same pattern shape as the reflective electrode.

Moreover, in the transflective liquid crystal display, both processes of forming the transmissive electrode and forming the reflective electrode are included. Therefore, in the transflective liquid crystal display, there are more photolithography processes required compared with the transmissive liquid crystal display and the reflective liquid crystal display. In order to reduce the number of photolithography processes, a technique of devising the photolithography is disclosed in Japanese Unexamined Patent Application Publication No. 2005-215277. In Japanese Unexamined Patent Application Publication No. 2005-215277, using a gray tone or a halftone exposure technique for the photolithography, the film thickness of the resist (photosensitive resin) pattern is changed for each part. By the resist pattern with different film thicknesses, the transmissive electrode and the reflective electrode are processed in one photolithography process.

However, when the metal film and the transparent conductive film formed thereover are collectively wet etched by the technique disclosed in Japanese Unexamined Patent Application No. 2005-275323, the transparent conductive film may hang over the metal film edge face and remain as a protruding shape (an overhang). FIGS. 8A to 8D are cross-sectional diagrams schematically showing a manufacturing process of a TFT array substrate in a transflective liquid crystal display according to Japanese Unexamined Patent Application Publication No. 2005-275323. In FIG. 8A, a first transparent conductive film 2 is formed and patterned over an interlayer insulating film 1 which is formed above a TFT (not shown), a scanning signal line (not shown) and a display signal line (not shown). Next, in FIG. 8B, a metal film 3 as a reflective electrode is formed to cover the first transparent conductive film 2. Then, a second transparent conductive film 4 is formed to prevent flicker and image sticking. Subsequently, a resist pattern 5 of desired shape is formed over the second transparent conductive film 4. The metal film 3 and the second transparent conductive film 4 are collectively wet etched with the resist pattern 5 being formed thereover, as shown in FIG. 8C. After that, the resist pattern 5 is removed and it becomes the configuration as shown in FIG. 8D.

When a multilayer thin film pattern is formed by the above method, the second transparent conductive film 4 which is the upper layer is formed to be protruding shape projected from the pattern end of the lower layer metal film 3. Especially when using isotropic etching such as wet etching, the protruding shape of the second transparent conductive film 4 is likely to appear. FIG. 9 is a partial enlarged diagram showing the state during the collective wet etching process of the second transparent conductive film 4 and the metal film 3. In isotropic etching, etching proceeds to the vertical and the horizontal directions at the same time. That is, while the etching of the second transparent conductive film 4 and the metal film 3 proceeds in the direction of film thickness, the etching also proceeds in the direction perpendicular to film thickness (side etch). By the side etch, as shown in FIG. 9, a hollow 6 is formed between an etching surface 7 of the metal film 3 and the resist pattern 5 surface during the etching. Since the etching proceeds also from this hollow 6, the protrusion is likely to be generated. Furthermore, generally the etching rate of the metal film 3 is faster than that of the second transparent conductive film 4, thus the metal film 3 is more likely to be side etched than the second transparent conductive film 4. Consequently, the second transparent conductive film 4 projects to form the protruding shape.

Thus, if the protrusion is formed in the edge face of the multilayer thin film, during the process of rubbing substrates such as a rubbing process in the next panel manufacturing process, the protruding portion comes off to be a cause of generating a contamination particle. Then, the piece of the separated film could lead to a short-out between adjacent pixels or between a pixel electrode and an opposing electrode, thereby causing a display failure. Moreover, when the edge face of the multilayer film pattern is covered with a covering film, continuity of the covering film is broken at the protruding portion. If the covering film is a protective insulating film, an insulation failure occurs in the portion of the discontinuity. If the covering film is a conductive film, an electric connection failure occurs in the portion of the discontinuity. As the definition of display devices advances higher in the future, pixel size and space between adjacent pixels will become smaller. Thus the process to more effectively prevent from generating the projection is required.

Moreover, in Japanese Unexamined Patent Application Publication No. 2005-215277, the resist pattern with different film thicknesses is used to form the transparent electrode and the reflective electrode. The thinner part of the resist pattern with different film thicknesses is removed by ashing. Oxygen plasma treatment is usually used for this ashing. However, according to the method of Japanese Unexamined Patent Application Publication No. 2005-215277, the ashing is performed while the transparent conductive film is exposed to the surface, and thus abnormal electrical discharge may arise. By abnormal electrical discharge, not only the transparent conductive film but the interlayer insulating film provided thereunder is also damaged. Furthermore, it may cause a failure such as a disconnection of the line provided in the lower layer.

The present invention is made in order to solve the above problems and an object of this invention is to provide a manufacturing method of a multilayer thin film pattern and a display device that can easily obtain a pattern with a desired shape.

SUMMARY OF THE INVENTION

According to an aspect of the present invention, there is provided a method of manufacturing a multilayer thin film pattern that includes forming a first thin film (for example the metal film 3 in the embodiments) over a substrate, forming a second thin film (for example the second transparent conductive film 4 in the embodiments) over the first thin film, forming a resist pattern over the second thin film, etching the second thin film using the resist pattern as a mask, transforming the resist pattern using an organic solvent or a RELACS agent to cover an edge face of the etched second thin film and etching the first thin film while the edge face of the second thin film is covered with the resist pattern.

According to another aspect of the present invention, there is provided a method of manufacturing a multilayer thin film pattern that includes forming an interlayer insulating film over a substrate, forming a conductive thin film over the interlayer insulating film, forming a thin film of one layer or more over the conductive thin film, forming a resist pattern having different film thicknesses by a multi-tone exposure over the thin film of one layer or more, etching the thin film of one layer or more and the conductive thin film using the resist pattern having different film thicknesses as a mask to expose the interlayer insulating film, ashing the resist pattern having different film thicknesses to remove a thin film part of the resist pattern and etching at least one layer of the thin film of one layer or more using the resist pattern without the thin film part as a mask.

The present invention is able to provide the manufacturing method of the multilayer thin film pattern and the display device which can easily obtain the pattern of desired shape.

The above and other objects and features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

Figure 1:
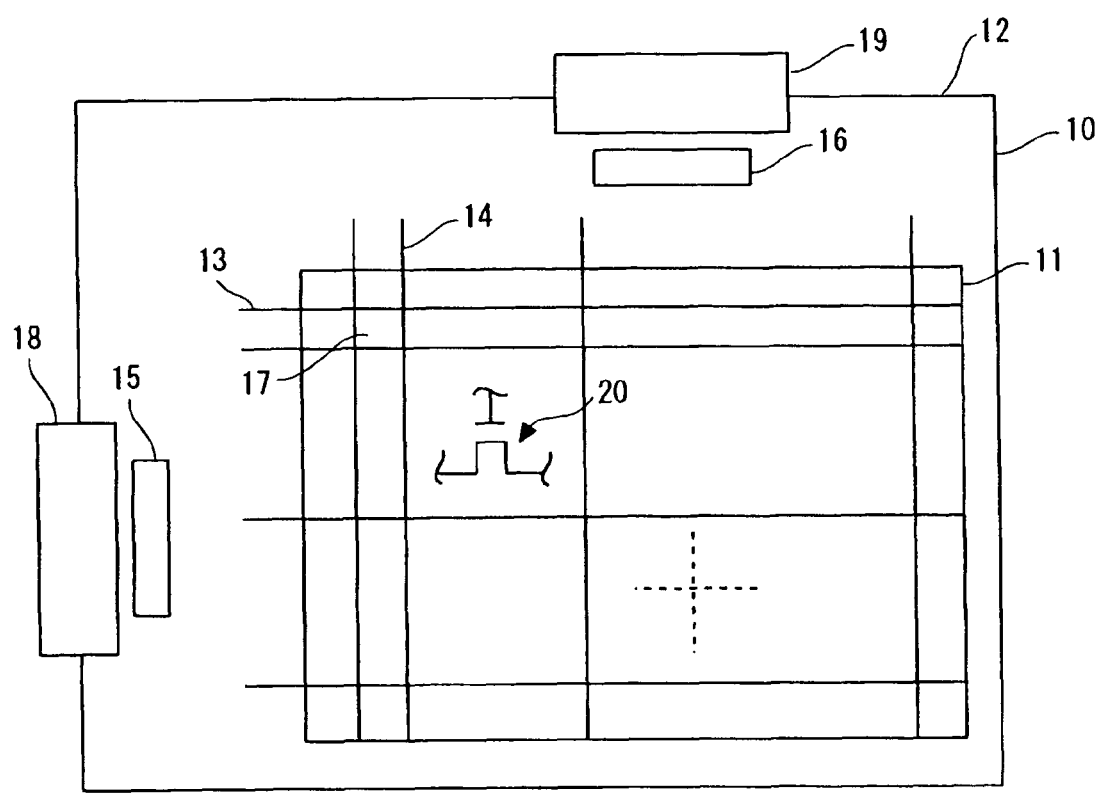
FIG. 1 shows the structure of an electrode substrate of a liquid crystal display according to the present invention.

Firstly, a display device according to the present invention is explained with reference to FIG. 1. FIG. 1 is a front view showing the structure of an electrode substrate used for a liquid crystal display. Although the display device according to the present invention is explained with a liquid crystal display as an example, it is only illustrative and a flat panel display or the like such as an organic EL display may be used. The overall structure of this liquid crystal display is common to the first to the sixth embodiments described below.

The display device according to the present invention includes an electrode substrate 10. To the electrode substrate 10, a display area 11 and a frame area 12 surrounding the display area 11 are provided. A plurality of scan signal lines 13 and a plurality of display signal lines 14 are formed in the display area 41. The plurality of scanning signal lines 13 are provided in parallel. Similarly, the plurality of display signal lines 14 are formed in parallel. The scanning signal line 13 and the display signal line 14 are formed to cross each other. The scanning signal line 13 and the display signal line 14 are orthogonal. Moreover, an area surrounded by adjacent scan signal lines 13 and display signal lines 14 is a pixel 17. Therefore, in the electrode substrate 10, the pixels 17 are arranged in matrix. As described above, the electrode substrate 10 is a TFT array substrate.

Furthermore, a scanning signal driving circuit 15 and a display signal driving circuit 16 are provided in the frame area 12 of the electrode substrate 10. The scanning signal lines 13 are extended from the display area 11 to the frame area 12. Then the scanning signal lines 13 are connected to the scanning signal driving circuit 15 at the end part of the electrode substrate 10. The display signal lines 14 are also extended from the display area 11 to the frame area 12. Then the display signal lines 13 are connected to the display signal driving circuit 16 at the end part of the electrode substrate 10. An external wiring 18 is connected near the scanning signal driving circuit 15. Furthermore, an external wiring 19 is connected near the display signal driving circuit 16. The external wirings 18 and 19 are wiring boards such as FPC (Flexible Printed Circuit).

Various signals from outside are supplied to the scanning signal driving circuit 15 and the display signal driving circuit 16 through the external wirings 18 and 19. The scanning signal driving circuit 15 supplies a scanning signal to the scanning signal line 13 based on a control signal from outside. By this scanning signal, the scanning signal lines 13 are selected sequentially. The display signal driving circuit 16 supplies a display signal to the display signal line 14 according to the control signal and display data from outside. This enables to supply a display voltage corresponding to the display data to each pixel 17. Note that the scanning signal driving circuit 15 and the display signal driving circuit 16 are not limited to the structure disposed over the electrode substrate 10. For example, the driving circuits may be connected by TCP (Tape Carrier Package).

At least one TFT 20 is formed in the pixel 17. An interlayer insulating film is formed over the TFT 20. The TFT 20 is disposed near the intersection of the display signal line 14 and the scanning signal line 13. The TFT 20 and the pixel are connected through a contact hole provided in the interlayer insulating film. For example, this TFT 20 supplies a display voltage to a pixel electrode. That is, the TFT 20, which is a switching device, is turned on by a scanning signal from the scanning signal line 13. This enables to apply the display voltage to the pixel electrode connected to a drain electrode of the TFT 20 from the display signal line 14. Then, an electric field according to the display voltage is generated between the pixel electrode and an opposing electrode. Note that an alignment layer (not shown) is formed over the surface of the electrode substrate 10.

Figure 2A:
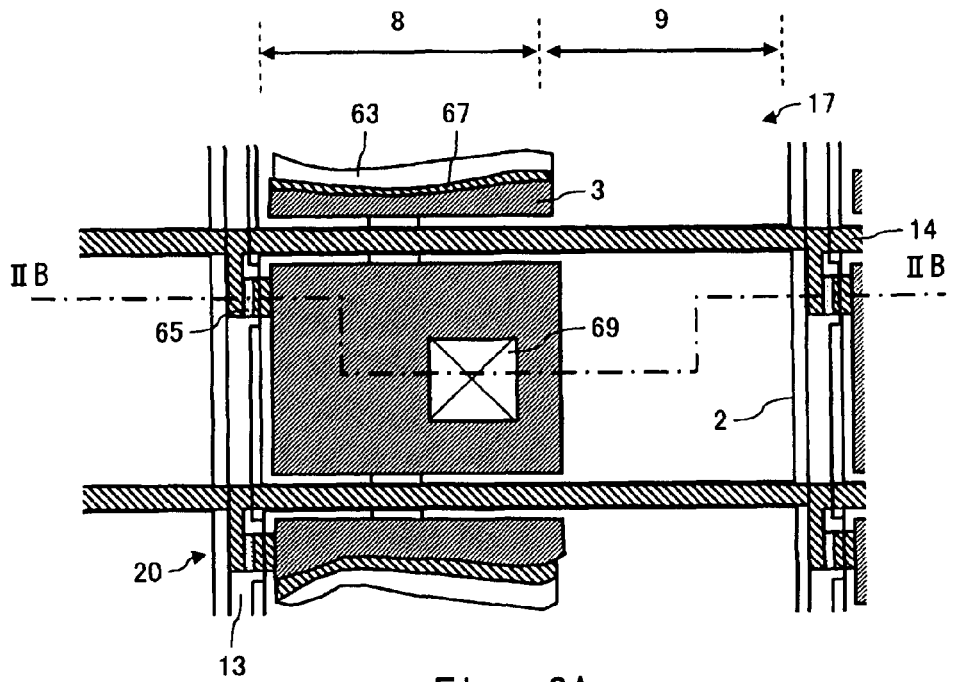
FIG. 2A is a plane view schematically showing the pixel structure of a transflective liquid crystal display according to the present invention.
Figure 2B:
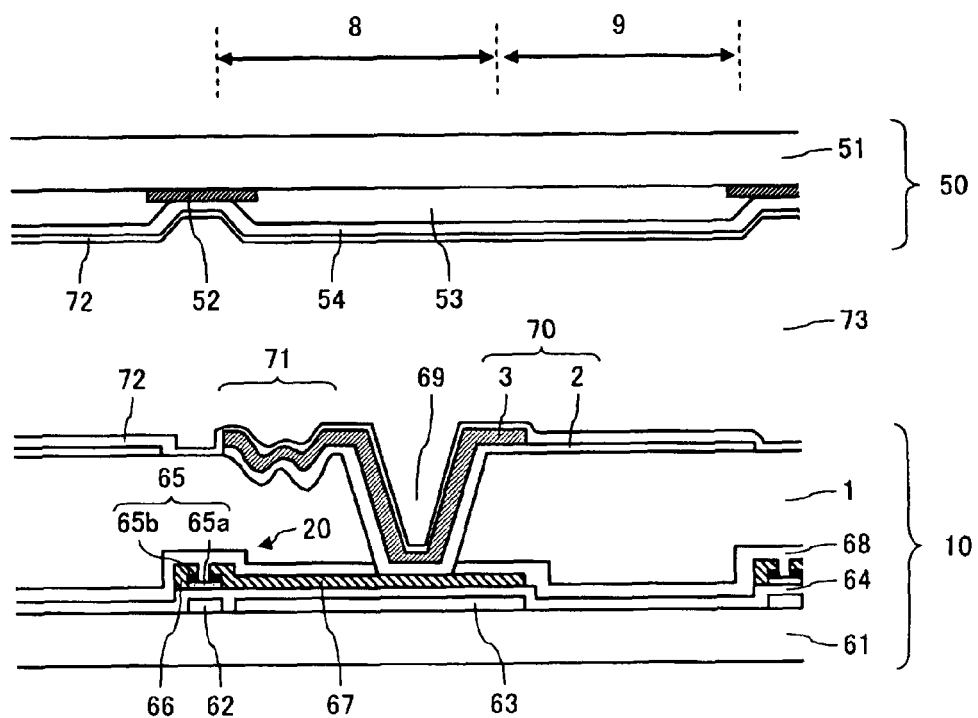
FIG. 2B is a cross-sectional diagram taken along the line IIB-IIB of FIG. 2A.

Here, the structure of the pixel 17 is explained in detail with reference to FIGS. 2A and 2B. In this example, the pixel structure of a transflective liquid crystal display which is an example of the display device according to the present invention is explained. FIG. 2A is a plane view schematically showing the pixel structure of the transflective liquid crystal display according to the present invention. FIG. 2B is a cross-sectional diagram taken along the line IIB-IIB of FIG. 2A. Note that in FIG. 2A, only the pixel structure on the side of the electrode substrate 10 is illustrated. In FIG. 2B, along with the cross-sectional diagram taken along the line IIB-IIB of the electrode substrate 10, the cross-sectional structure on the side of the opposing substrate corresponding to the IIB-IIB cross section of the electrode substrate 10 is also illustrated. Although an example of using a channel-etch type inverted staggered TFT is illustrated in FIGS. 2A and 2B, it is not limited to this. For example, it may be an etch-stopper or a top-gate type TFT.

In FIG. 2A, the plurality of scanning signal lines (gate lines) 13 are formed in the vertical direction. The plurality of display signal lines (source lines) 14 are formed in the horizontal direction. The area surrounded by the adjacent scanning signal lines 13 and the display signal lines 14 is the pixel 17. Over a substrate 61 of the electrode substrate 10, the scanning signal line 13, a gate electrode 62, and a common capacitor electrode 63 are formed in the same layer. The substrate 61 is a transparent insulating substrate such as glass and plastic. The scanning signal line 13 is connected to the gate electrode 62 outside the TFT 20. A gate insulating film 64 is formed to cover the gate electrode 62, the scanning signal line 13 and the common capacitor electrode 63, as shown in FIG. 2B.

A semiconductor layer 65 of the TFT 20 is formed over the gate insulating film 64. The semiconductor layer 65 is disposed near the intersection of the scanning signal line 13 and the display signal line 14. Specifically, the semiconductor layer 65 is provided opposite to the gate electrode 62 with the gate insulating film 64 interposed therebetween. The semiconductor layer 65 is formed of an intrinsic amorphous semiconductor layer (an i layer) 65a and an n-type amorphous semiconductor layer (an n layer) 65b. The i layer 65a is provided over the gate insulating film 64 and has substantially the same size as the gate electrode 62. The n layer 65b is provided over the i layer 65a. The n layer 65b corresponding to between a source electrode 66 and a drain electrode 67 which are described later is removed by a back channel etching. That is, the n layer 65b is formed between the source electrode 66 and the i layer 65a and between the drain electrode 67 and the i layer 65a.

Furthermore, the source electrode 66 and the drain electrode 67 are provided over the gate insulating film 64 and respectively connected with the n layer 65b of the semiconductor layer 65. The source electrode 66 is connected with the display signal line 14 outside the TFT 20. The drain electrode 67 is extended over the common capacitor electrode 63. For the drain electrode 67, the portion opposed to the common capacitor electrode 63 functions as a capacitor electrode for forming an additional capacitance of each pixel. A storage capacitor is formed by this capacitor electrode of the drain electrode 67, the common capacitor electrode 63 placed opposite, and the gate insulating film 64 interposed therebetween. Therefore, the gate insulating film 64 over the common capacitor electrode 63 functions as a capacitor dielectric film of the storage capacitor. The common capacitor electrode 63 is disposed between adjacent scanning signal lines 13. The common capacitor electrodes 63 are connected between the adjacent pixels 17 to form a common capacitor line as shown in FIG. 2A. Within the pixel 17, the common capacitor line is formed widely to be the common capacitor electrode 63. The width of the common capacitor line is narrow in the portion intersecting the display signal line 14 so as to reduce parasitic capacitance. The common capacitor line is parallel to the scanning signal line 13.

An interlayer insulating film 68 is formed to cover the source electrode 66 and the drain electrode 67. Over the interlayer insulating film 68, an interlayer insulating film 1 such as an organic planarizing film is provided. A contact hole 69 which penetrates the interlayer insulating films 1 and 68 is formed over the drain electrode 67. A pixel electrode 70 is provided to connect to the drain electrode 67 through this contact hole 69. A first transparent conductive film 2 is formed in a transmissive area 9 and a reflective area 8 as the pixel electrode 70. Moreover, a metal film 3 is further formed in the reflective area 8 of the pixel electrode 70 over the first transparent conductive film 2. Therefore, the portion provided with the metal film 3 in the pixel 17 is to be the reflective area 8. The pixel 17 other than the reflective area 8 is to be the transmissive area 9. The metal film 3 is disposed over the common capacitor electrode 63. That is, in the reflective area 8, a storage capacitor is provided under the metal film 3. Note that although a second transparent conductive film 4 may be further stacked over the metal film 3 to prevent image sticking, it is not shown in FIG. 2B.

An alignment layer 72 is formed to the surface of the electrode substrate 10 to cover the pixel electrode 70. Note that in the reflective area 8, an uneven portion 71 is provided in order to improve the display properties of reflection mode. The uneven pattern is formed to the surface of the interlayer insulating film 1 in the uneven portion 71. Then, in the uneven portion 71, the metal film 3 formed thereover is also uneven to conform to the uneven pattern of the interlayer insulating film 1.

Furthermore, an opposing substrate 50 is disposed opposite to the electrode substrate 10. The opposing substrate 50 is for example a color filter substrate and is disposed to the visible side. A color filter 53, a black matrix (BM) 52, an opposing electrode 54, an alignment layer 72 and so on are formed to the opposing substrate 50.

Specifically, to the surface of the substrate 51 opposing to the electrode substrate 10, the black matrix 52 is formed. The black matrix 52 is made of pigment or metal such as chromium and blocks light. The black matrix 52 is provided in the area opposed to the scanning signal line 13 and the display signal line 14. Then, the color filter 53 made from pigment or dye is formed to fill the area surrounded by the black matrix 52. The color filter 53 is disposed opposite to the pixel electrode 70. The color filter 53 is a colored layer of R (red), G (green), and B (blue), for example. Furthermore, the opposing electrode 54 is formed substantially all over the display area 11 to cover the black matrix 52 and the color filter 53. Moreover, the alignment layer 72 is stacked to the surface of the opposing substrate 50. Note that the opposing electrode 54 may be disposed to the electrode substrate 10 side.

Then, a liquid crystal layer 73 is held between the electrode substrate 10 and the opposing substrate 50. That is, liquid crystal is filled in between the electrode substrate 10 and the opposing substrate 50. Furthermore, a polarizing plate and a retardation film, etc. are provided to the surface outside of the electrode substrate 10 and the opposing substrate 50. Moreover, a back light unit or the like is placed to the non-visible side of the liquid crystal display panel.

The liquid crystal is driven by the electric field between the pixel electrode 70 and the opposing electrode 54. That is, an alignment direction of the liquid crystal between the substrates changes. This changes the polarization state of a light passing through the liquid crystal layer 73. To be more specific, the light that has passed the polarizing plate and has become a linearly polarized light changes its polarization state by the liquid crystal layer 73. More specifically, the light from the backlight unit becomes a linearly polarized light by the polarizing plate provided to the electrode substrate 10 side. Further, by the linearly polarized light passing through the liquid crystal layer 73, the polarization state changes.

Accordingly, the amount of light passing through the polarizing plate of the opposing substrate 50 side varies according to the polarization state. More specifically, among transmitted light transmitting from the backlight unit through the liquid crystal panel, the amount of light passing through the polarizing plate of the visible side varies. The alignment direction of the liquid crystal varies according to the applied display voltage. Therefore, by controlling the display voltage, the amount of light passing through the polarizing plate of the visible side can be changed. That is, by varying the display voltage by each pixel, a desired image can be displayed.

First Embodiment

Next, a manufacturing method of a multilayer thin film pattern according to a first embodiment is explained with reference to FIGS. 3A to 3G. FIGS. 3A to 3G are cross-sectional diagrams schematically showing the manufacturing process of the multilayer thin film pattern according to the first embodiment. In this embodiment, although the manufacturing method of a reflective electrode and a transmissive electrode in a pixel electrode of a transflective liquid crystal display is described as a preferred example of a multilayer thin film pattern and a display device, it is not limited to this. Various multilayer thin film patterns and display devices can be formed by changing thin films for forming the multilayer thin film variously.

Figure 3A:
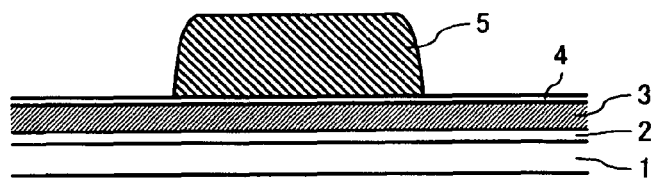
FIGS. 3A to 3G schematically show a manufacturing process of a multilayer thin film pattern according to a first embodiment.

Firstly, in FIGS. 3A to 3G, as with FIGS. 8A to 8D, the interlayer insulating film 1 such as an organic planarizing film is formed above the TFT 20, the scanning signal line 13 and the display signal line 14, as shown in FIGS. 2A and 2B. In FIGS. 3A to 3G, the part below the interlayer insulating film 1 is omitted. In FIG. 3A, the first transparent conductive film 2, the metal film 3 to be a reflective electrode, and the second transparent conductive film 4 for preventing image sticking are deposited in order over the interlayer insulating film 1. Al or an alloy mainly using Al, for example, is used for the metal film 3. Moreover, the first transparent conductive film 2 and the second transparent conductive film 4 are transparent conductive films such as ITO and ITZO. Then, a resist pattern 5 of desired planar shape is formed by photolithography over the second transparent conductive film 4.

Figure 3B:
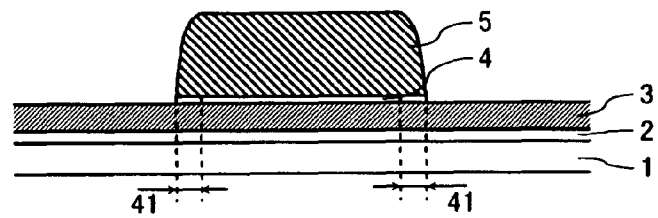

Next, in FIG. 3B, the second transparent conductive film 4 is selectively etched until its edge is retracted under the resist pattern 5. In this process, isotropic etching such as wet etching can be used. At this time, a retracting amount (side etch amount) 41 of the second transparent conductive film 4 from the edge face of the resist pattern 5 by side etch shall be more than the side etch amount of the metal film 3, which is described later. Here, only as a guide, the side etch amount 41 shall be approximately more than twice the film thickness of the metal film 3.

Figure 3C:
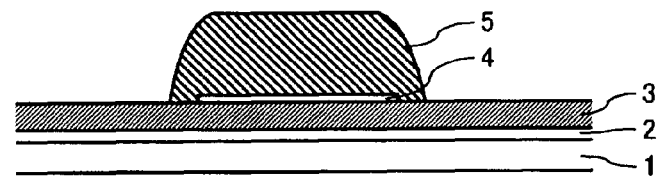

Next, the resist pattern 5 is transformed by a reflow of the resist using an organic solvent so that the resist pattern 5 covers the edge face of the second transparent conductive film 4. For example, by exposing the resist pattern 5 to organic solvent atmosphere under low temperature of about 20 to 35 degrees Celsius, the resist pattern 5 is transformed largely in a short time. This enables to protect the entire second transparent conductive film 4 by the resist pattern 5, as shown in FIG. 3C. The transformation of the resist using the organic solvent is disclosed in Kido, S. et al. "Late-News Paper: A 14-in. LCD Panel Formed Using New 4-Mask Technology with Chemical Re-Flow Technique", SID International Symposium Digest of Technical Papers, 2006. pp. 1650-1653.

Figure 3D:
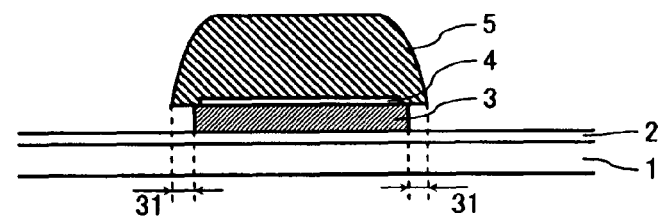
Figure 3E:
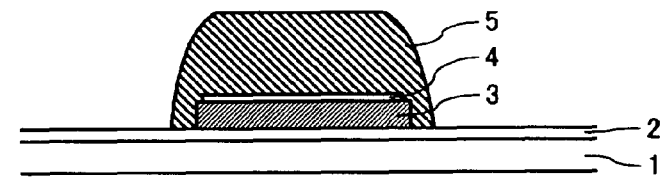

Then, in FIG. 3D, isotropic etching of the metal film 3 is selectively carried out. For example, wet etching can be used. Even a small amount of the remaining metal film 3 will have a harmful effect on product performance. Thus the metal film 3 must be sufficiently over etched. Therefore, in consideration of the variation in etching and the homogeneity, the etching process corresponding about 1.5 to the 2 times of the film thickness of the metal film 3 is performed. At this time, a retracting amount (side etch amount) 31 of the metal film 3 from the edge face of the resist pattern 5 by side etch is about 1.5 to 2 times of the film thickness of the metal film 3. That is, the retracting amount 31 of the metal film 3 becomes smaller than the retracting amount 41 of the second transparent conductive film 4. Consequently, the bottom surface of the second transparent conductive film 4 is not exposed during the etching process of the metal film 3, thereby enabling to prevent from generating the protruding portion by the second transparent conductive film 4. Furthermore, as with FIG. 3C, the resist pattern 5 is transformed again by the reflow of the resist using an organic solvent so that the resist pattern 5 covers the edge face of the metal film 3. This enables to protect the second transparent conductive film 4 and the metal film 3 entirely by the resist pattern 5, as shown in FIG. 3E.

Figure 3F:
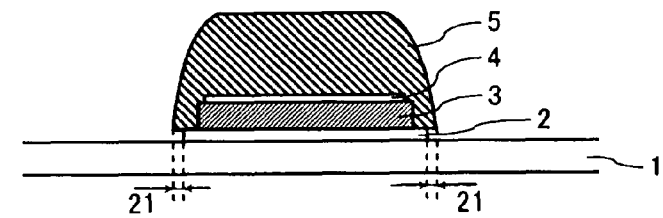

After that, in FIG. 3F, the first transparent conductive film 2 is etched. At this time, the first transparent conductive film 2 is etched in such a way that a retracting amount 21 of the first transparent conductive film 2 from the edge face of the resist pattern 5 becomes less than the retracting amount 31 of the metal film 3. This enables the metal film 3 not to project from the edge face of the first transparent conductive film 2, thereby preventing from generating the protruding portion. Here, wet etching can be used, for example.

Figure 3G:
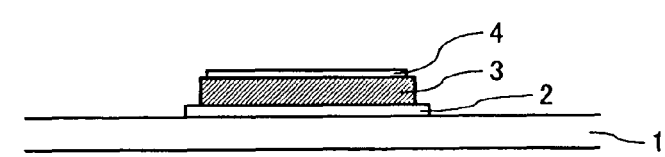

Lastly, when the resist pattern 5 is removed, the multilayer thin film pattern without the protruding portion can be obtained as shown in FIG. 3G.

As described above, in this embodiment, using the resist pattern 5 as a mask, isotropic etching is performed to the second transparent conductive film 4 formed below the mask. At this time, the second transparent conductive film 4 is selectively etched until its retracting amount 41 becomes more than twice the film thickness of the metal film 3. Then, the resist pattern 5 is transformed by the reflow of the resist using an organic solvent so that the resist pattern 5 covers the edge face of the second transparent conductive film 4. After that, the metal film 3 formed under the second transparent conductive film 4 is etched. Accordingly, in patterning the second transparent conductive film 4 and the metal film 3 using one resist pattern 5, the second transparent conductive film 4 does not project from the edge face of the metal film 3 and the generation of the protruding portion can be prevented. Moreover, a multilayer thin film pattern of 2 layers or more can be patterned using one resist pattern 5. By using the reflow of the resist using an organic solvent, it is possible to transform the resist pattern 5 largely in a short time.

Furthermore, in this embodiment, after etching the metal film 3, the resist pattern 5 is transformed again by the reflow of the resist using an organic solvent to cover the edge face of a metal film 3. Then, the first transparent conductive film 2 formed under the metal film 3 is etched so that the retracting amount 21 of the first transparent conductive film 2 may become less than the retracting amount 31 of the metal film 3. This enables the metal film 3 not to project from the edge face of the first transparent conductive film 2, thereby preventing from generating the protruding portion. That is, by repeating the transformation of the resist pattern 5 by the reflow of the resist using an organic solvent and the etching, it is possible to prevent from generating the protruding portion in patterning of the multilayer thin film pattern of 3 layers or more using one resist pattern 5. That is, the multilayer thin film pattern is formed stepwise. This embodiment is especially preferable when the etch selectivity of the first transparent conductive film 2 over the second transparent conductive film 4 is low, ½ or more and less than 2, preferably around 1. Moreover, it is possible to pattern a multilayer thin film pattern of 3 layers or more using one resist pattern 5. Therefore, a multilayer thin film pattern of desired sectional shape can be obtained easily.

Second Embodiment

Next, a manufacturing method of a multilayer thin film pattern according to a second embodiment is explained. Since the manufacturing process of this embodiment is identical to that of the first embodiment except the transformation method of the resist pattern 5, the explanation is omitted.

After etching the second transparent conductive film 4, in FIG. 3C, by expansion of the resist size using RELACS (Resolution Enhancement Lithography Assisted by Chemical Shrink), the entire resist pattern 5 is transformed to cover the edge face of the second transparent conductive film 4. Specifically, RELACS agent is applied over the resist pattern 5 and heated. This makes an acid in the resist pattern 5 spread to initiate a crosslinking reaction with the RELACS agent. That is, the RELACS agent near the resist pattern 5 changes and adheres to the surface of the resist pattern 5 to form a thermally-hardened resin layer. Subsequently, the RELACS agent of the unadhered part is removed by development, cleaning, or the like. This makes the RELACS agent adhere to the resist pattern 5 covering the edge face of the second transparent conductive film 4, and the entire resist pattern 5 expands.

Although the temperature of the heat applied to the RELACS agent is about 100 to 120 degrees Celsius, the thickness of the layer adhering to the resist pattern 5 can be controlled by adjusting this temperature. This enables to expand the resist pattern 5 size for about 0.5 to 1 μm. Since the film thickness of the second transparent conductive film 4 is about 0.005 to 0.01 μm, the entire second transparent conductive film 4 is sufficiently protected by the resist pattern 5 and the RELACS agent adhering to the resist pattern 5. The transformation of the resist using the RELACS agent is disclosed in Toyoshima, T. et al. "0.1 μm Level Contact Hole Pattern Formation with KrF Lithography by Resolution Enhancement Lithography Assisted by Chemical Shrink (RELACS)", IEDM, 1998. pp. 333-336.

Moreover, similarly in FIG. 3E, the entire resist pattern 5 is transformed to cover the edge face of the metal film 3 by expansion of the resist size using RELACS.

As described above, in this embodiment, the resist pattern 5 is transformed by expansion of the resist size using RELACS after the etching process of the second transparent conductive film 4. Thus, as with the first embodiment, in patterning the second transparent conductive film 4 and the metal film 3 using one resist pattern 5, the second transparent conductive film 4 does not project from the edge face of the metal film 3 and the generation of the protruding portion can be prevented. Moreover, a multilayer thin film pattern of 2 layers or more can be patterned using one resist pattern 5. Therefore, a multilayer thin film pattern of desired sectional shape can be obtained easily.

Furthermore, in this embodiment, after etching the metal film 3, the resist pattern 5 is transformed again by expansion of the resist size using RELACS to cover the edge face of the metal film 3. Then, the first transparent conductive film 2 formed under the metal film 3 is etched. This enables the metal film 3 not to project from the edge face of the first transparent conductive film 2, thereby preventing from generating the protruding portion. That is, by repeating the transformation by expansion of the resist size using RELACS and the etching, the same effect as the first embodiment can be created and it is possible to prevent from generating the protruding portion in patterning of the multilayer thin film pattern of 3 layers or more using one resist pattern 5. This embodiment is especially preferable when the etch selectivity of the first transparent conductive film 2 over the second transparent conductive film 4 is low, ½ or more and less than 2, preferably around 1. Moreover, it is possible to pattern a multilayer thin film pattern of 3 layers or more using one resist pattern 5.

Third Embodiment

Next, a manufacturing method of a multilayer thin film pattern according to a third embodiment is explained with reference to FIGS. 4A to 4G. In the manufacturing method of a pixel electrode of a transflective liquid crystal display, multiphase exposure (multi-tone exposure) technique by a gray tone mask or a halftone mask may be used to form a transmissive electrode and a reflective electrode. By photolithography using the multi-tone exposure, a thick resist pattern 5a in a reflective area and a thin resist pattern 5b in a transmissive area of a pixel electrode can be simultaneously formed. The transmissive electrode and the reflective electrode are formed using the thickness difference of the resist pattern 5. In this embodiment, an example is explained where the manufacturing method of a multilayer thin film pattern according to the present invention is incorporated when forming a transmissive electrode and a reflective electrode by the photolithography using the multi-tone exposure.

Figure 4A:
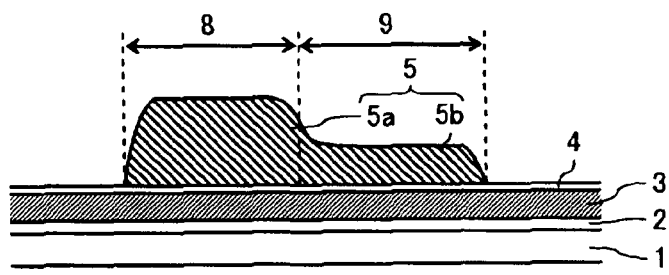
FIGS. 4A to 4G schematically show a manufacturing process of a multilayer thin film pattern according to a third embodiment.

FIGS. 4A to 4G are cross-sectional diagrams schematically showing the manufacturing process of the multilayer thin film pattern according to the third embodiment. In FIGS. 4A to 4G, components identical to those in FIGS. 3A to 3G are denoted by reference numerals identical to those therein and the differences are explained. Firstly, in FIGS. 4A to 4G as with FIGS. 3A to 3G, the interlayer insulating film 1 such as an organic planarizing film is formed above the TFT 20, the scanning signal line 13 and the display signal line 14, as shown in FIGS. 2A and 2B. In FIGS. 4A to 4G, the part below the interlayer insulating film 1 is omitted. In FIG. 4A, the first transparent conductive film 2, the metal film 3 to be a reflective electrode, and the second transparent conductive film 4 for preventing image sticking are deposited in order. Then, the resist pattern 5 of desired plane shape is formed by a photolithography over the second transparent conductive film 4. Here, using a gray tone mask etc., the resist pattern 5 is formed so that the resist pattern 5a in the reflective area 8 is thicker than the resist pattern 5b in the transmissive area 9. That is, the thick film part of the resist pattern 5 with different film thicknesses is to be the resist pattern 5a and the thin film part is to be the resist pattern 5b.

Figure 4B:
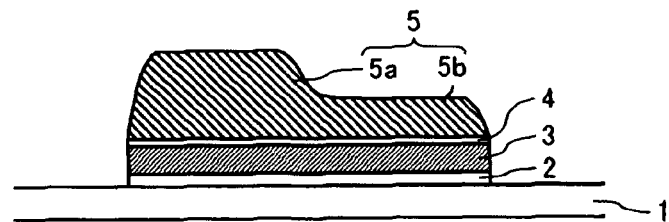

Next, in FIG. 4B, the second transparent conductive film 4, the metal film 3 and the first transparent conductive film 2 are collectively etched. Or the second transparent conductive film 4, the metal film 3 and the first transparent conductive film 2 may be separately etched. In such case, each film is patterned corresponding to the shape of the resist pattern 5 in order from the upper layer using an etchant which selectively etches each film.

Figure 4C:
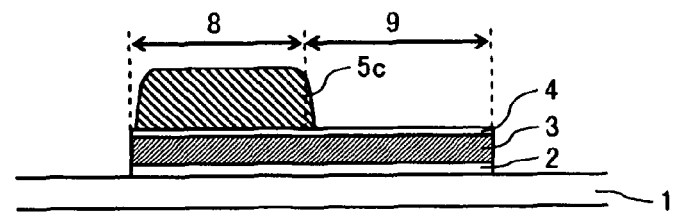
Figure 4D:
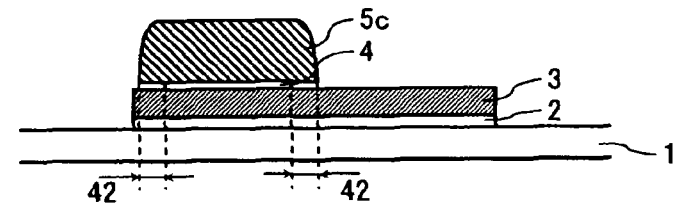

Then, the resist pattern 5 is ashed so that the resist pattern 5 may be removed in the transmissive area 9 of the pixel electrode and remain only in the reflective area 8, as shown in FIG. 4C. For example, ashing is performed in oxygen plasma. If the resist is removed until the surface of the second transparent conductive film 4 is exposed in the transmissive area 9, a resist pattern 5c is shaped to cover the reflective area 8. This allows the thin resist pattern 5b to be removed and the thick resist pattern 5a to become thin but remain as the resist pattern 5c. By this ashing, the resist pattern 5c retracts from the edge face of the second transparent conductive film 4. After that, the second transparent conductive film 4 is selectively patterned by isotropic etching. By using isotropic etching, the second transparent conductive film 4 becomes smaller than the outer shape of the resist pattern 5c and side etched as shown in FIG. 4D. At this time, it is desirable that a retracting amount 42 of the second transparent conductive film 4 from the edge face of the resist pattern 5c is more than the retracting amount of the metal film 3 mentioned later. Here, only as a guide, the second transparent conductive film 4 is etched until the retracting amount 42 is approximately more than twice the film thickness of the metal film 3.

Figure 4E:
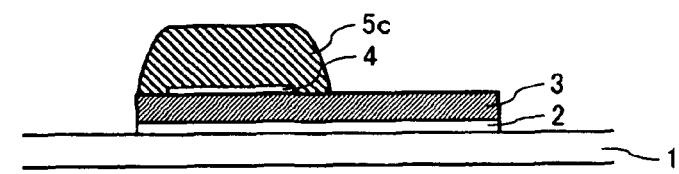

Next, the resist pattern 5c is transformed by the reflow of the resist using an organic solvent so that the resist pattern 5 covers the edge face of the second transparent conductive film 4. This enables to protect the entire second transparent conductive film 4 by the resist pattern 5c, as shown in FIG. 4E. At this time, the edge faces of the metal film 3 and the first transparent conductive film 2 are not covered with the resist pattern 5c but are exposed.

Figure 4F:
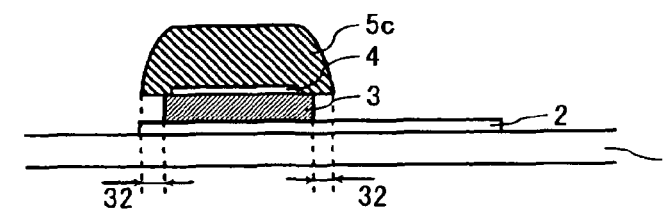

After that, in FIG. 4F, isotropic etching of the metal film 3 is selectively carried out. For example, wet etching can be used. At this time, even a small amount of the remaining metal film 3 will have a harmful effect on product performance. Thus the metal film 3 must be sufficiently over etched. Therefore, in consideration of the variation in etching and the homogeneity, the etching process corresponding about 1.5 to the 2 times of the film thickness of the metal film 3 is performed. At this time, a retracting amount (side etch amount) 32 of the metal film 3 from the edge face of the resist pattern 5c is about 1.5 to 2 times of the film thickness of the metal film 3. That is, the retracting amount 32 of the metal film 3 becomes smaller than the retracting amount 42 of the second transparent conductive film 4. Consequently, the bottom surface of the second transparent conductive film 4 is not exposed during the etching process of the metal film 3, thereby enabling to prevent from generating the protruding portion by the second transparent conductive film 4.

Figure 4G:
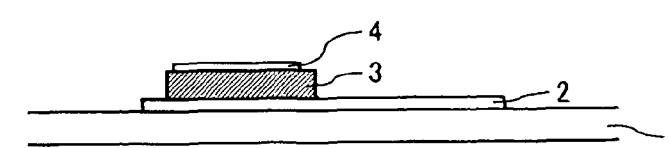

Lastly, when the resist pattern 5c is removed, the multilayer thin film pattern with no protruding portion as shown in FIG. 4G can be obtained. That is, the multilayer thin film pattern is formed stepwise.

As described above, in this embodiment, a transmissive electrode and a reflective electrode are formed by photolithography using multi-tone exposure. At this time, the second transparent conductive film 4 for preventing image sticking is selectively etched using isotropic etching until its retracting amount 42 becomes more than twice the film thickness of the metal film 3 to be a reflective electrode. Then, after transforming the resist pattern 5c by the reflow of the resist using an organic solvent to cover the edge face of the second transparent conductive film 4, the metal film 3 is etched. Accordingly, in patterning the second transparent conductive film 4 and the metal film 3 using one resist pattern 5c, the second transparent conductive film 4 does not project from the edge face of the metal film 3 and the generation of the protruding portion can be prevented. Therefore, a multilayer thin film pattern of desired sectional shape can be obtained easily. Moreover, by using the reflow of the resist using an organic solvent, it is possible to transform the resist pattern 5c largely in a short time.

Note that in this embodiment, an example is explained in which the resist pattern 5c is transformed by the reflow of the resist using an organic solvent in the process of transforming the resist pattern 5c, however it is not limited to this. As with the second embodiment, the resist pattern 5c may be transformed by expansion of the resist size using RELACS. Then the same effect as the third embodiment can be achieved and in forming the multilayer thin film pattern using one resist pattern 5c, it is possible to prevent from generating the protruding portion.

Fourth Embodiment

A manufacturing method of a multilayer thin film pattern according to a fourth embodiment is explained with reference to FIGS. 5A to 5I. In this embodiment, as with the third embodiment, another example is explained where the manufacturing method of a multilayer thin film pattern according to the present invention is incorporated when forming a transmissive electrode and a reflective electrode by the photolithography using the multi-tone exposure. Since the manufacturing process of this embodiment is identical to that of the third embodiment excluding a part of the process, the explanation is omitted. That is, in the fourth embodiment, a different method from the third embodiment is used in the process corresponding to FIG. 4B of the third embodiment.

FIGS. 5A to 5I are cross-sectional diagrams schematically showing the manufacturing process of the multilayer thin film pattern according to the fourth embodiment. Firstly, in FIGS.

Figure 5A:
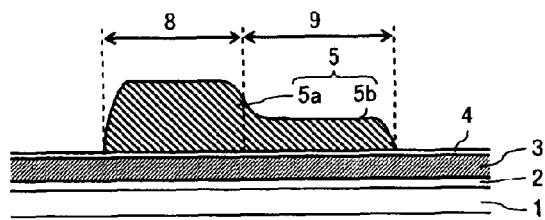
FIGS. 5A to 5I schematically show a manufacturing process of a multilayer thin film pattern according to a fourth embodiment.

5A to 5I, as with FIGS. 4A to 4G, the interlayer insulating film 1 such as an organic planarizing film is formed above the TFT 20, the scanning signal line 13 and the display signal line 14, as shown in FIGS. 2A and 2B. In FIGS. 5A to 5I, the part under the interlayer insulating film 1 is omitted. In FIG. 5A as with FIG. 4A, the first transparent conductive film 2, the metal film 3 to be a reflective electrode, and the second transparent conductive film 4 for preventing image sticking are deposited in order over the interlayer insulating film 1. Then, furthermore, the resist pattern 5 of desired plane shape is formed by photolithography thereover. Here, using a gray tone mask etc., the resist pattern 5 is formed so that the resist pattern 5a in the reflective area 8 is thicker than the resist pattern 5b in the transmissive area 9.

Figure 5B:
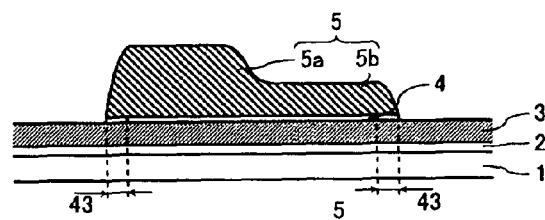
Figure 5C:
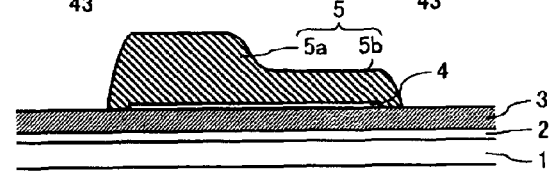

Next, in FIG. 5B, isotropic etching is selectively performed to the second transparent conductive film 4. For example, wet etching can be used. At this time, it is desirable that a retracting amount 43 of the second transparent conductive film 4 from the edge face of the resist pattern 5 is more than the retracting amount of the metal film 3 mentioned later. For example, only as a guide, the second transparent conductive film 4 is etched until the retracting amount 43 is approximately more than twice the film thickness of the metal film 3. Then, a part of the second transparent conductive film 4 is removed and the metal film 3 is exposed outside of the resist pattern 5. Then, as with the first embodiment, the resist pattern 5 is transformed by the reflow of the resist using an organic solvent so that the resist pattern 5 covers the edge face of the second transparent conductive film 4. This enables to protect the entire second transparent conductive film 4 by the resist pattern 5, as shown in FIG. 5C.

Figure 5D:
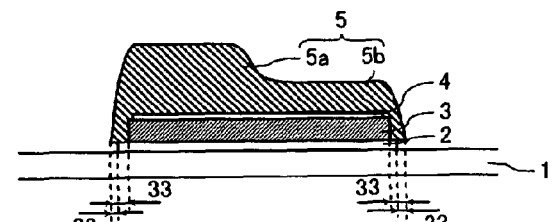

Subsequently, in FIG. 5D, isotropic etching of the metal film 3 is selectively carried out. For example, wet etching can be used. Even if a sufficient etching which corresponds about 1.5 to 2 times of the film thickness of the metal film 3 is performed at this time, a retracting amount 33 of the metal film 3 from the edge face of the resist pattern 5 becomes less than the retracting amount 43 of the second transparent conductive film 4. After etching the metal film 3, the resist pattern 5 is transformed again by the reflow of the resist using an organic solvent to cover the edge face of the metal film 3. Then the second transparent conductive film 4 and the metal film 3 is protected entirely by the resist pattern 5. Then, an etching process is performed to the first transparent conductive film 2. Here, the etching is performed so that a retracting amount 23 of the first transparent conductive film 2 from the edge face of the resist pattern 5 may become less than the retracting amount 33 of the metal film 3.

Note that in the process of FIG. 5D, after etching the metal film 3, the etching of the first transparent conductive film 2 is performed after transforming the resist pattern 5 to cover the edge face of the metal film 3. However, the first transparent conductive film 2 may be etched without transforming the resist pattern 5. For example, for the etching of the metal film 3 and the transparent conductive film 2, dry etching may be used to collectively etch them.

Figure 5E:
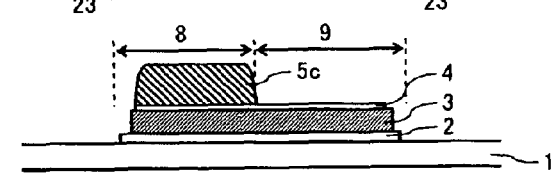
Figure 5F:
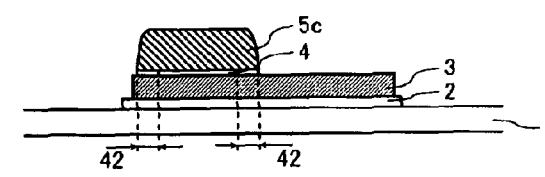
Figure 5G:
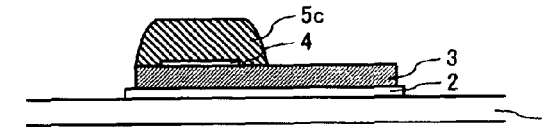
Figure 5H:
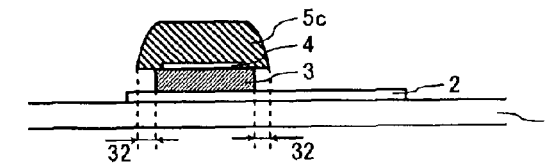
Figure 5I:
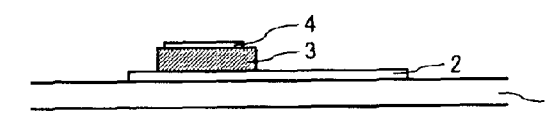

Thus, the edge face of the upper film is formed inside of the edge face of the lower layer film and it is patterned to be the shape in which the upper film is not projected. Subsequently, the process after FIG. 5E is the same as that of the third embodiment shown in FIGS. 4C to 4G. That is, in FIG. 5E, the resist pattern 5 is ashed to expose the second transparent conductive film 4 in the transmissive area 9. Then, as shown in FIGS. 5F to 5H, the second transparent conductive film 4 and the metal film 3 are etched. By removing the resist pattern 5c lastly, the multilayer thin film pattern without the protruding portion can be obtained as shown in FIG. 5I. That is, the multilayer thin film pattern is formed stepwise.

As described above, in this embodiment, the edge face of the second transparent conductive film 4, which is the upper layer, is protected by the transformation of the resist pattern 5 also in the process corresponding to FIG. 4B of the third embodiment. That is, when etching the lower layer film after etching the second transparent conductive film 4, the edge face of the second transparent conductive film 4 is to be covered with the resist pattern 5. Then the protruding shape can be controlled more certainly. Therefore, the multilayer thin film pattern of desired sectional shape can be obtained easily. This embodiment is especially preferable when the etch selectivity of the first transparent conductive film 2 and the second transparent conductive film 4 is low, ½ or more and less than 2, preferably around 1.

Note that in this embodiment, an example is explained in which the resist pattern 5 is transformed by the reflow of the resist using an organic solvent in the process of transforming the resist pattern 5, however it is not limited to this. As with the second embodiment, the resist pattern 5 may be transformed by expansion of the resist size using RELACS. Then the same effect as the fourth embodiment can be achieved and in forming the multilayer thin film pattern using one resist pattern 5, it is possible to prevent from generating the protruding portion.

Fifth Embodiment

A manufacturing method of a multilayer thin film pattern according to a fifth embodiment is explained with reference to FIGS. 6A to 6D. In this embodiment, as with the third and the fourth embodiments, another example is explained where the manufacturing method of a multilayer thin film pattern according to the present invention is incorporated when forming a transmissive electrode and a reflective electrode by the photolithography using the multi-tone exposure.

Figure 6A:
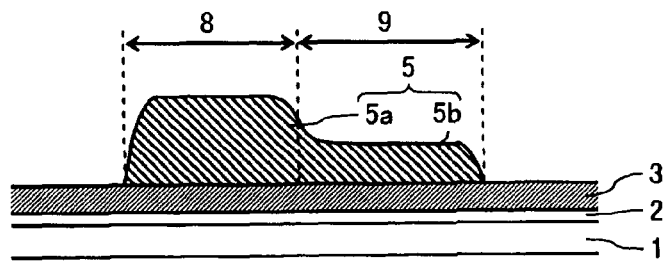
FIGS. 6A to 6D schematically show a manufacturing process of a multilayer thin film pattern according to a fifth embodiment.

FIGS. 6A to 6D are cross-sectional diagrams schematically showing the manufacturing process of the multilayer thin film pattern according to the fifth embodiment. In FIGS. 6A to 6D, components identical to those in FIGS. 4A to 4G and FIGS. 5A to 5I are denoted by reference numerals identical to those therein and the differences are explained. Firstly, in FIGS. 6A to 6D, as with FIGS. 4A to 4G and FIGS. 5A to 5I, the interlayer insulating film 1 such as an organic planarizing film is formed above the TFT 20, the scanning signal line 13 and the display signal line 14, as shown in FIGS. 2A and 2B. In FIGS. 6A to 6D, the part under the interlayer insulating film 1 is omitted. In FIG. 6A of this embodiment, the first transparent conductive film 2 to be a transmissive electrode and the metal film 3 to be a reflective electrode are deposited in order over the interlayer insulating film 1. Then, the resist pattern 5 of desired plane shape is formed by a photolithography over the metal film 3. Here, using multi-tone exposure technique, the resist pattern 5 is formed so that the resist pattern 5a in the reflective area 8 is thicker than the resist pattern 5b in the transmissive area 9. Then, the resist pattern 5 with different film thicknesses is formed over the metal film 3.

Figure 6B:
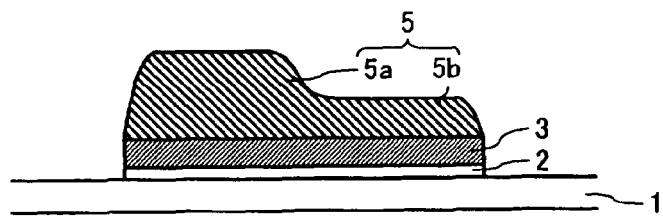

Next, in FIG. 6B, the metal film 3 and the first transparent conductive film 2 are etched using the resist pattern 5 as a mask. At this time, in order to prevent abnormal electric discharge in ashing described later, the first transparent conductive film 2 is also etched. That is, the first transparent conductive film 2 is removed along with the metal film 3 so that the interlayer insulating film 1 is exposed in the area not provided with the resist pattern 5. Here, the metal film 3 and the first transparent conductive film 2 may be etched one by one separately or may be etched collectively. When the metal film 3 and the first transparent conductive film 2 are etched collectively, the number of process step can be reduced, thereby improving the productivity. Then the metal film 3 and the first transparent conductive film 2 are patterned to remain only under the resist pattern 5.

Figure 6C:
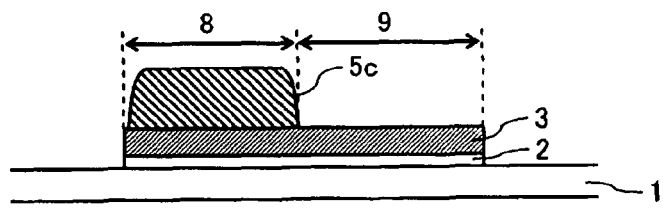

Then, the resist pattern 5 is ashed so that the resist pattern 5 may be removed in the transmissive area 9 and remain only in the reflective area 8 of the pixel electrode, as shown in FIG. 6C. Ashing is carried out by plasma treatment in oxygen atmosphere. At this time, the first transparent conductive film 2 is not exposed to the surface in this embodiment. That is, at the start of the ashing, the entire first transparent conductive film 2 is covered with the resist pattern 5 and it is possible to prevent faults such as abnormal electric discharge during ashing. When the resist is removed until the surface of the metal film 3 is exposed in the transmissive area 9, the resist pattern 5c is formed to cover the reflective area 8. Then the thin resist pattern 5b is removed and the thick resist pattern 5a becomes thin but remains as the resist pattern 5c. By this ashing, the resist pattern 5c retracts from the edge face of the metal film 3.

Figure 6D:
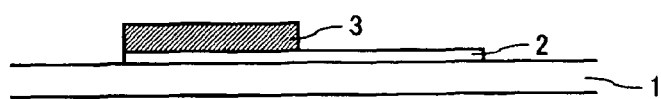

Subsequently, the metal film 3 is selectively etched with the resist pattern 5c disposed thereon. Then the metal film 3 in the transmissive area 9 is removed. Lastly, by removing the resist pattern 5c, the stepwise multilayer thin film pattern as shown in FIG. 6D can be obtained.

As described above, in this embodiment, a transmissive electrode and a reflective electrode are formed by the photolithography using multi-tone exposure. Before ashing the resist pattern 5 with different film thicknesses, the first transparent conductive film 2 is also etched so that the interlayer insulating film 1 is exposed. By such method, it is possible to prevent from generating faults such as abnormal electric discharge during ashing and also to obtain a multilayer thin film pattern of desired shape easily. Moreover, patterns of a transmissive electrode area and a reflective electrode area can be formed in one photolithography process, thereby improving the productivity.

Note that this embodiment can be combined with the first to the fourth embodiment. Specifically, when etching the metal film 3 and the first transparent conductive film 2 separately in FIG. 6B, it may be etched in the following way. The metal film 3 is etched using the resist pattern 5 having different film thicknesses as a mask. Then, by the reflow of the resist using an organic solvent or the expansion of the resist size by RELACS, the resist pattern 5 is transformed to cover the edge face of the metal film 3. Then, the first transparent conductive film 2 is etched. At this time, the first transparent conductive film 2 is etched so that the retracting amount of the first transparent conductive film 2 from the edge face of the resist pattern 5 becomes less than the retracting amount of the metal film 3. This enables to prevent from generating the protruding portion. Moreover, in this embodiment, an example of forming a multilayer thin film pattern including 2 layers of conductive thin films having the metal film 3 stacked over the first transparent conductive film 2 is explained, however it is not limited to this. It may be a case of forming a multilayer thin film having an insulating film for example stacked to the conductive thin film over the interlayer insulating film 1.

Sixth Embodiment

A manufacturing method of a multilayer thin film pattern according to a sixth embodiment is explained with reference to FIGS. 7A to 7D. In this embodiment, as with the third to the fifth embodiments, another example is explained where the manufacturing method of a multilayer thin film pattern according to the present invention is incorporated when forming a transmissive electrode and a reflective electrode by the photolithography using the multi-tone exposure.

Figure 7A:
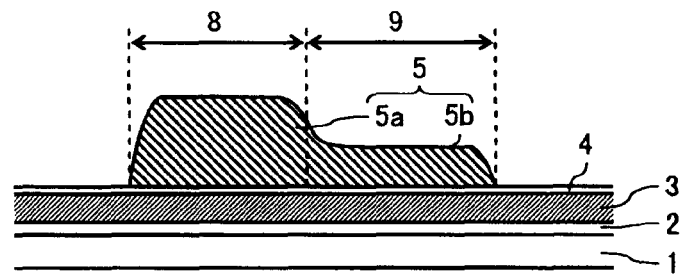
FIGS. 7A to 7D schematically show a manufacturing process of a multilayer thin film pattern according to a sixth embodiment.

FIGS. 7A to 7D are cross-sectional diagrams schematically showing the manufacturing process of the multilayer thin film pattern according to the sixth embodiment. In FIGS. 7A to 7D, components identical to those in FIGS. 4A to 4G, FIGS. 5A to 5I and FIGS. 6A to 6D are denoted by reference numerals identical to those therein and the differences are explained. Firstly, in FIGS. 7A to 7D, as with FIGS. 4A to 4G, FIGS. 5A to 5I and FIGS. 6A to 6D, the interlayer insulating film 1 such as an organic planarizing film is formed above the TFT 20, the scanning signal line 13 and the display signal line 14, as shown in FIGS. 2A and 2B. In FIGS. 7A to 7D, the part under the interlayer insulating film 1 is omitted. In FIG. 7A of this embodiment, the first transparent conductive film 2 to be a transmissive electrode, the metal film 3 to be a reflective electrode, and the second transparent conductive film 4 for preventing image sticking are deposited in order over the interlayer insulating film 1. Then, the resist pattern 5 of desired plane shape is formed by photolithography over the second transparent conductive film 4. Using multi-tone exposure technique, the resist pattern 5 is formed so that the resist pattern 5a in the reflective area 8 is thicker than the resist pattern 5b in the transmissive area 9. Then, the resist pattern 5 with different film thicknesses is formed over the metal film 3.

Figure 7B:
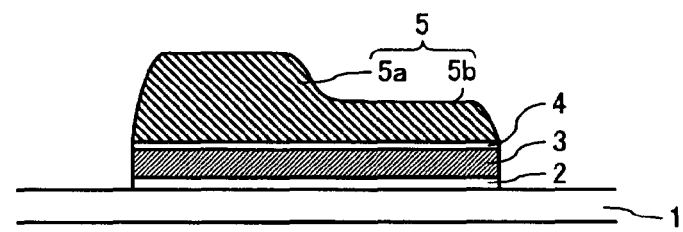

Next, in FIG. 7B, the second transparent conductive film 4, the metal film 3 and the first transparent conductive film 2 are etched using the resist pattern 5 as a mask. At this time, in order to prevent abnormal electric discharge in ashing described later, the first transparent conductive film 2 is also etched. That is, the metal film 3 and the first transparent conductive film 2 are removed along with the second transparent conductive film 4 so that the interlayer insulating film 1 is exposed in the area not provided with the resist pattern 5. Here, the second transparent conductive film 4, the metal film 3 and the first transparent conductive film 2 may be etched one by one separately or may be etched collectively. By etching the second transparent conductive film 4, the metal film 3 and the first transparent conductive film 2 collectively, the number of process step can be reduced, thereby improving the productivity. Then the second transparent conductive film 4, the metal film 3 and the first transparent conductive film 2 are patterned to remain only under the resist pattern 5.

Figure 7C:
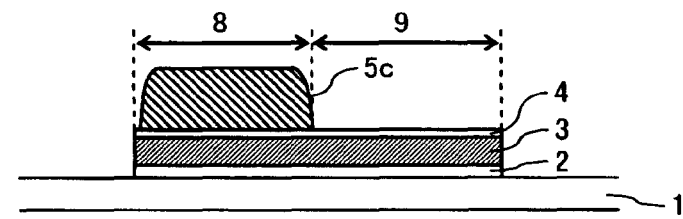

Then, the resist pattern 5 is ashed so that the resist pattern 5 may be removed in the transmissive area 9 and remain only in the reflective area 8 of the pixel electrode, as shown in FIG. 7C. Ashing is carried out by plasma treatment in oxygen atmosphere. At this time, the metal film 3 and the first transparent conductive film 2 are not exposed to the surface in this embodiment. That is, at the start of the ashing, the entire first transparent conductive film 2 is covered with the resist pattern 5 and it is possible to prevent faults such as abnormal electric discharge during ashing. When the resist is removed until the surface of the second transparent conductive film 4 is exposed in the transmissive area 9, the resist pattern 5c is shaped to cover the reflective area 8. Then the thin resist pattern 5b is removed and the thick resist pattern 5a becomes thin but remains as the resist pattern 5c. By this ashing, the resist pattern 5c retracts from the edge face of the second transparent conductive film 4.

Figure 7D:
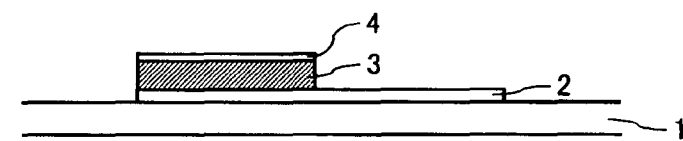
Figure 8A:
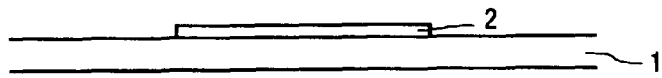
FIGS. 8A to 8D schematically show a manufacturing process of a multilayer thin film pattern according to a related art.
Figure 8B:
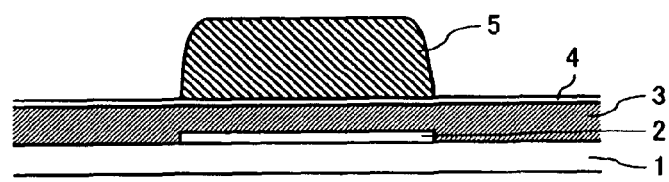
Figure 8C:
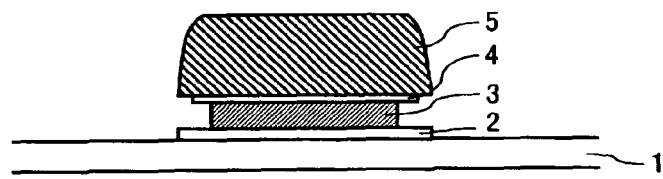
Figure 8D:
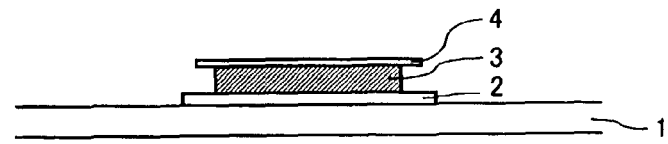
Figure 9:
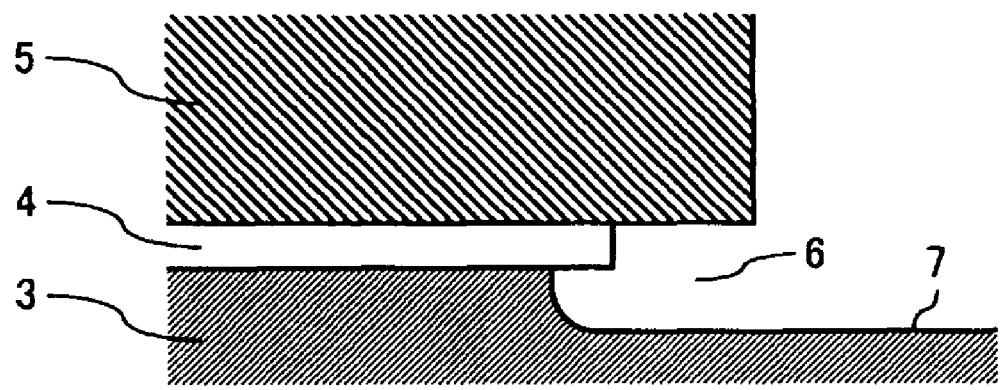
FIG. 9 is a partial enlarged diagram showing an etching process of a multilayer thin film pattern according to a related art.

Subsequently, the second transparent conductive film 4 and the metal film 3 are selectively etched with the resist pattern 5c disposed thereover. Then the second transparent conductive film 4 and the metal film 3 in the transmissive area 9 are removed. Lastly, by removing the resist pattern 5c, the stepwise multilayer thin film pattern as shown in FIG. 7D can be obtained.

As described above, in this embodiment, a transmissive electrode and a reflective electrode are formed by the photolithography using multi-tone exposure. Before ashing the resist pattern 5 with different film thicknesses, the first transparent conductive film 2 is also etched so that the interlayer insulating film 1 is exposed. By such method, it is possible to prevent from generating faults such as abnormal electric discharge during ashing and also to obtain a multilayer thin film pattern of desired shape easily. Moreover, patterns of a transmissive electrode area and a reflective electrode area can be formed in one photolithography process, thereby improving the productivity.

Note that this embodiment can be combined with the first to the fourth embodiments. More specifically, after ashing in FIG. 7C, the second transparent conductive film 4 and the metal film 3 may be etched using the method of FIGS. 4D to 4G according to the third embodiment, instead of FIG. 7D. Moreover, after forming the resist pattern 5 with different film thicknesses in FIG. 7A, the second transparent conductive film 4, the metal film 3 and the first transparent conductive film 2 may be etched using the method of FIGS. 5B to 5D, instead of FIG. 7B. This enables to prevent from generating the protruding portion. Furthermore, in this embodiment, an example is described that forms a multilayer thin film pattern including 3 layers of conductive thin films having the first transparent conductive film 2, the metal film 3 and the second conductive film 4 stacked sequentially, however it is not limited to this. That is, it may be a case of forming a multilayer thin film pattern having 2 layers or more of thin films stacked to the conductive thin film over the interlayer insulating film 1. The thin film of 2 layers or more formed over the conductive thin film may be an insulating layer.

In the first to the sixth embodiments, although the metal film 3 is explained as a single layer formed of Al or an alloy mainly using Al as an example, it is not limited to this but may be a stacked layer of 2 or more kinds of layers. For example, the metal film 3 may have the structure in which Al, Ag or an alloy mainly using these materials is stacked over a layer of Cr, Mo, W, Ti or an alloy mainly using these materials. By using Al, Ag or an alloy mainly using these materials to the upper layer side of the metal film 3, the optical property of reflection improves. Moreover, by using Cr, Mo, W, Ti or an alloy mainly using these materials to the lower layer side of the metal film 3, an electric connection with the first transparent conductive film 2 formed below the metal film 3 improves.

Furthermore, in order to improve optical property of reflection, an uneven portion may be formed to the interlayer insulating film 1 of the reflective area 8. The uneven portion of this interlayer insulating film 1 is not illustrated in FIGS. 4A to 4G, FIGS. 5A to 5I, FIGS. 6A to 6D and FIGS. 7A to 7D.

Although in this embodiment, the manufacturing method of a reflective electrode and a transmissive electrode in a pixel electrode of a transflective liquid crystal display is explained as a preferred example of a multilayer thin film pattern and a display device, it is not limited to this. Various multilayer thin film patterns and display devices can be formed by changing thin films for forming the multilayer thin film variously. For example, it may be a multilayer thin film including a metal film for forming a source electrode and a drain electrode of a TFT and a transparent conductive film made of ITO etc. formed thereover. Moreover, both of the reflow of the resist using an organic solvent and the expansion of resist size by RELACS may be combined. That is, the first transformation of the resist pattern 5 may be performed by the reflow of the resist using an organic solvent and the second transformation of the resist pattern 5 may be performed by the expansion of resist size using RELACS. Conversely, the first transformation of the resist pattern 5 may be performed by the expansion of resist size using RELACS and the second transformation of the resist pattern 5 may be performed by the reflow of the resist using an organic solvent.

The above explanation is to describe the embodiments of the present invention and the present invention is not limited to the above embodiments. Moreover, those skilled in the art can change, add and change each component of the above embodiments easily in the scope of the present invention.

From the invention thus described and it will be obvious that the embodiments of the invention may be varied in many ways. Such variations are not to be regarded as a departure from the spirit and scope of the invention and all such modifications as would be obvious to one skilled in the art are intended for inclusion within the scope of the following claims.

What is claimed is:

1. A method of manufacturing a multilayer thin film pattern comprising:
   forming a first thin film over a substrate, the first thin film being a metal film;
   forming a second thin film over the first thin film;
   forming a resist pattern over the second thin film;
   etching the second thin film using the resist pattern as a mask;
   transforming the resist pattern using an organic solvent or an organic reflow agent to cover an edge face of the etched second thin film; and
   etching the first thin film while the edge face of the second thin film is covered with the resist pattern.

2. The method according to claim 1, wherein the organic reflow agent initiates a crosslinking reaction with the resist pattern by heat and forms a resin layer to a surface of the resist pattern.

3. The method according to claim 1, wherein in the etching of the second thin film, the second thin film is etched to retract from an edge face of the resist pattern, and
   a retracting amount of the second thin film from the edge face of the resist pattern is more than twice a thickness of the first thin film.

4. The method according to claim 1, further comprising:
   transforming the resist pattern using the organic solvent or the organic reflow agent to cover an edge face of the etched first thin film; and
   etching a third thin film provided under the first thin film while the edge faces of the first and the second thin films are covered by the resist pattern.

5. The method according to claim 4, wherein an etching selectivity of the second thin film over the third thin film in the etching of the third film is ½ or more and less than 2.

6. The method according to claim 4, wherein in the etching of the first thin film, the first thin film is etched to retract from the edge face of the resist pattern, and
   a retracting amount of the first film from the edge face of the resist pattern is not less than a thickness of the third thin film and also not more than a retracting amount of the second thin film.

7. The method according to claim 6, wherein in the etching of the third thin film, a retracting amount of the third thin film from the edge face of the resist pattern is not more than the retracting amount of the first thin film.

8. The method according to claim 7, wherein the first thin film includes Al and the second and the third thin films are transparent conductive films.

9. The method according to claim 1, wherein the formation of the resist pattern includes;
forming a resist pattern having different film thicknesses by multi-tone exposure; and
ashing the resist pattern having different film thicknesses to remove a thin film part of the resist pattern,
wherein in the etching of the second thin film, the second thin film is etched using the resist pattern without the thin film part as a mask.

10. The method according to claim 1, wherein in the formation of the resist pattern, a resist pattern having different film thicknesses is formed by multi-tone exposure, and
in the etching of the second thin film, the second thin film is etched using the resist pattern having different film thicknesses as a mask, the resist pattern having different film thicknesses is ashed to remove a thin film part and the second thin film is etched using the resist pattern without the thin film part as a mask.

11. The method according to claim 9, further comprising:
forming an interlayer insulating film between the substrate and the first thin film; and
etching the second and the first thin films using the resist pattern having different film thicknesses as a mask before ashing to expose the interlayer insulating film.

12. The method according to claim 10, further comprising:
forming an interlayer insulating film between the substrate and the first thin film,
wherein in the etching of the second thin film, the second and the first thin films are etched using the resist pattern having different film thicknesses as a mask before ashing to expose the interlayer insulating film.

13. A method of manufacturing a multilayer thin film pattern comprising:
forming an interlayer insulating film over a substrate;
forming a conductive thin film over the interlayer insulating film;
forming a thin film of one layer or more over the conductive thin film, the thin film of one layer or more including a metal film layer;
forming a resist pattern having different film thicknesses by a multi-tone exposure over the thin film of one layer or more;
etching the thin film of one layer or more and the conductive thin film using the resist pattern having different film thicknesses as a mask to expose the interlayer insulating film;
ashing the resist pattern having different film thicknesses to remove a thin film part of the resist pattern; and
etching at least one layer of the thin film of one layer or more using the resist pattern without the thin film part as a mask.

14. A method of manufacturing a display device using the method according to claim 1.

15. A method of manufacturing a display device using the method according to claim 13.

* * * * *